(12) United States Patent  
Chumakov et al.

(10) Patent No.: US 8,785,271 B2  
(45) Date of Patent: Jul. 22, 2014

(54) DRAM CELL BASED ON CONDUCTIVE NANOCHANNEL PLATE

(75) Inventors: Dmytro Chumakov, Dresden (DE); Wolfgang Buchholtz, Radebeul (DE); Petra Hetzer, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 784 days.

(21) Appl. No.: 13/017,682

(22) Filed: Jan. 31, 2011

(65) Prior Publication Data

US 2012/0193807 A1 Aug. 2, 2012

(51) Int. Cl.
*H01L 21/8242* (2006.01)

(52) U.S. Cl.
USPC ........... 438/239; 438/381; 438/672; 438/675; 257/E21.585

(58) Field of Classification Search
CPC ................... H01L 21/46877; H01L 21/76897; H01L 27/10852
See application file for complete search history.

(56) References Cited

U.S. PATENT DOCUMENTS 7,371,635 B2 * 5/2008 Takaya ........................ 438/239
2011/0241166 A1 * 10/2011 Chumakov .................... 257/532

* cited by examiner

*Primary Examiner* — Daniel Whalen
(74) *Attorney, Agent, or Firm* — Ditthavong & Steiner, P.C.

(57) ABSTRACT

A capacitor is formed in nano channels in a conductive body. Embodiments include forming a source contact through a first inter layer dielectric (ILD), forming a conductive body on the first ILD, forming a second ILD on the conductive body, forming drain and gate contacts through the second ILD, conductive body, and first ILD, forming nano channels in the conductive body, forming an insulating layer in the channels, and metalizing the channels. An embodiment includes forming the nano channels by forming a mask on the second ILD, the mask having features with a pitch of 50 nanometers (nm) to 100 nm, etching the second ILD through the mask, etching the conductive body through the mask to a depth of 80% to 90% of the thickness of the conductive body, and removing the mask.

14 Claims, 7 Drawing Sheets

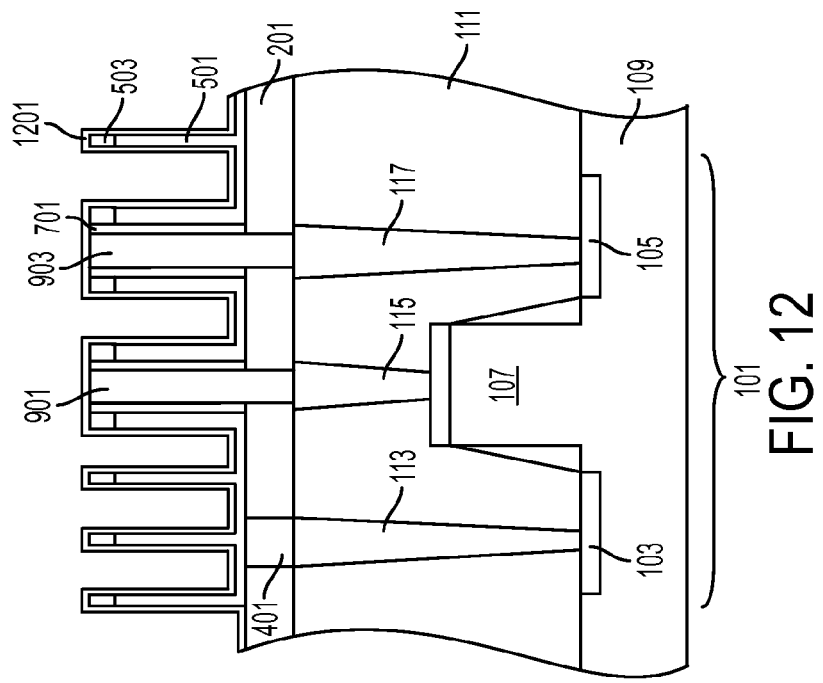
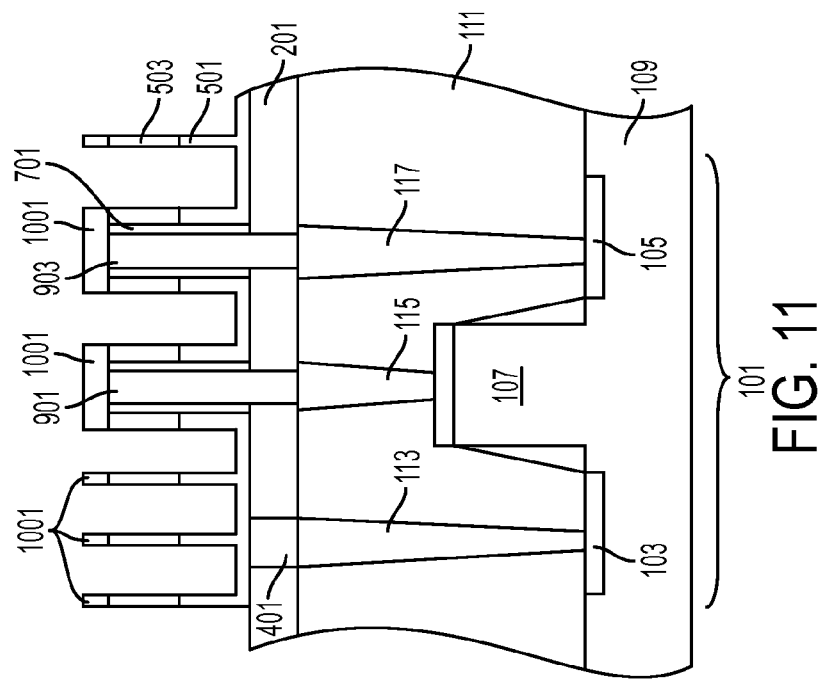

DRAM CELL BASED ON CONDUCTIVE NANOCHANNEL PLATE

TECHNICAL FIELD

The present disclosure relates to dynamic random access memory (DRAM) and eDRAM cells having an improved capacitor. The present disclosure is particularly applicable to semiconductor chips that require embedded DRAMs.

BACKGROUND

A one-transistor dynamic memory cell includes a pass-gate, a storage capacitor, and electrical connections to a bit-line, a word-line, and a capacitor plate. The trend has been to decrease the size of the memory cell, to provide higher packing density, while increasing device operating speed. Current memory cells include either deep trench capacitors or back end of line (BEOL) stacked capacitors. However, these solutions are formidable and complex to manufacture.

A need therefore exists for improved methodology enabling the manufacture of DRAM cells with effective capacitance, and the resulting devices.

SUMMARY

An aspect of the present disclosure is an improved method of forming a large capacitor by forming nano channels in a conductive body.

Another aspect of the present disclosure is a capacitor formed in nano channels in a conductive body.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of forming a source contact through a first inter layer dielectric (ILD); forming a conductive body on the first ILD; forming a second ILD on the conductive body; forming drain and gate contacts through the second ILD, conductive body, and first ILD; forming nano channels in the conductive body; forming an insulating layer in the channels; and metalizing the channels.

Aspects of the present disclosure include forming the drain and gate contacts by: forming first openings through the second ILD and conductive body; forming an insulating liner in the first openings; forming a second opening through the first ILD; and filling the first and second openings with metal. Another aspect includes forming the first openings by: forming a mask on the second ILD; etching the second ILD and conductive body through the first mask. Further aspects include forming the insulating liner of silicon oxide or a high-k oxide. Other aspects include forming the insulating liner to a thickness less than 5 nanometers (nm). Additional aspects include forming the first ILD of a material that has etch selectivity with the conductive body. Another aspect includes forming the conductive body of doped polysilicon; and forming the first ILD of silicon nitride. Further aspects include forming the nano channels by: forming an opening through the second ILD; and forming an opening in the conductive body. Further aspects include forming the openings by: forming a nano patterning mask on the second ILD; etching the second ILD through the nano patterning mask; partially etching the conductive body through the nano patterning mask; and removing the nano patterning mask. Other aspects include etching the conductive body to a depth of 80% to 90% of the thickness of the conductive body. Another aspect includes forming the nano patterning mask having features with a pitch of 50 nanometers (nm) to 100 nm. Additional aspects include forming the insulating layer of a high-k material.

Another aspect of the present disclosure is a device including: an ILD; a conductive body having nano channels, each nano channel including: an insulating layer deposited in the nano channels; and a metal filling the remaining space in the nano channels; a source contact electrically connected to the conductive body through the ILD; a gate contact through, and electrically insulated from, the conductive body; and a drain contact through, and electrically insulated from, the conductive body.

Aspects include a device having an insulating liner between the gate and drain contacts and the conductive body, electrically insulating the contacts from the conductive body. Further aspects include the insulating liner being formed of silicon oxide or a high-k oxide. Other aspects include the nano channels having a pitch of 50 nanometers (nm) to 100 nm. Another aspect includes a second ILD on the metal filling the nano channels. Additional aspects include a transistor under the first ILD, electrically connected to the source, gate, and drain contacts.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 1 through 14 schematically illustrate a process flow for forming a DRAM cell, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the complex manufacturing problems attendant upon forming deep trench capacitors or BEOL stacked capacitors. In accordance with embodiments of the present disclosure, nano channels are formed in a conductive body, an insulator layer is deposited, and the nano channels are metalized. In this embodiment, since a stacked patterned electrode is employed, inefficient ILD patterning used for typical metal/metal capacitors may be avoided and the number of manufacturing steps may be reduced. Further, the capacitance may be improved.

Methodology in accordance with embodiments of the present disclosure includes forming a source contact through a first ILD, forming a conductive body on the first ILD, forming a second ILD on the conductive body, forming drain and gate contacts through the second ILD, conductive body, and first ILD, forming nano channels in the conductive body, forming an insulating layer in the channels, and metalizing the channels.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
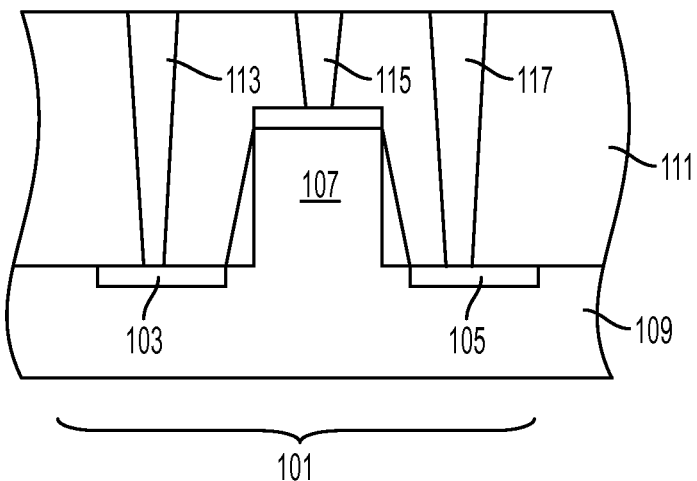

Adverting to FIG. 1, a transistor 101 having source 103, drain 105, and polysilicon gate 107 is formed on a silicon substrate 109. A first ILD 111 is formed over transistor 101. Contacts 113, 115, and 117 are formed through ILD 111 down to source 103, gate 107 and drain 105, respectively. ILD 111 may be formed of silicon dioxide ($SiO_2$).

Figure 2:
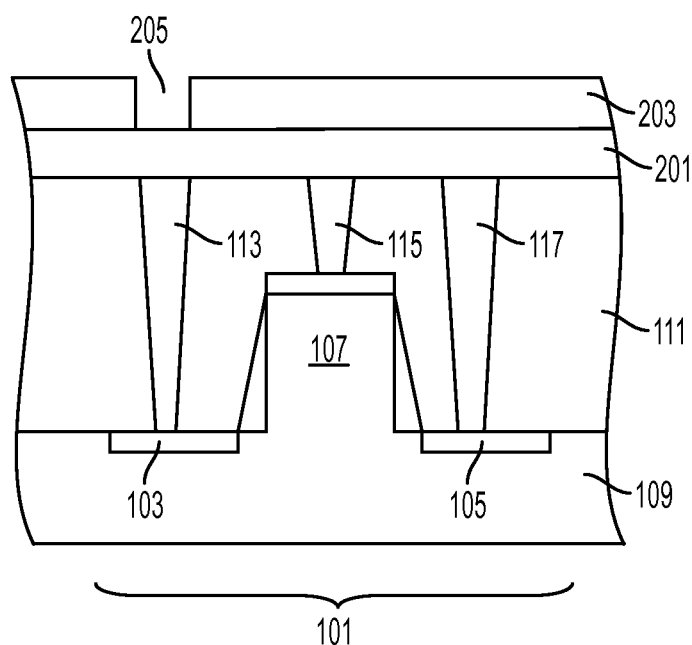

A second ILD 201 is formed to a thickness of 50 nm to 150 nm over first ILD 111 and contacts 113, 115, and 117, as illustrated in FIG. 2. ILD 201 may be formed of silicon nitride (SiN), or any suitable material with a high etch selectivity relative to ILD 111. A lithography mask 203 is applied to ILD 201 and developed by any suitable lithography process to form opening 205 over source contact 113. Opening 205 will define an intermediate contact to the body of the nano channel plate.

Figure 3:
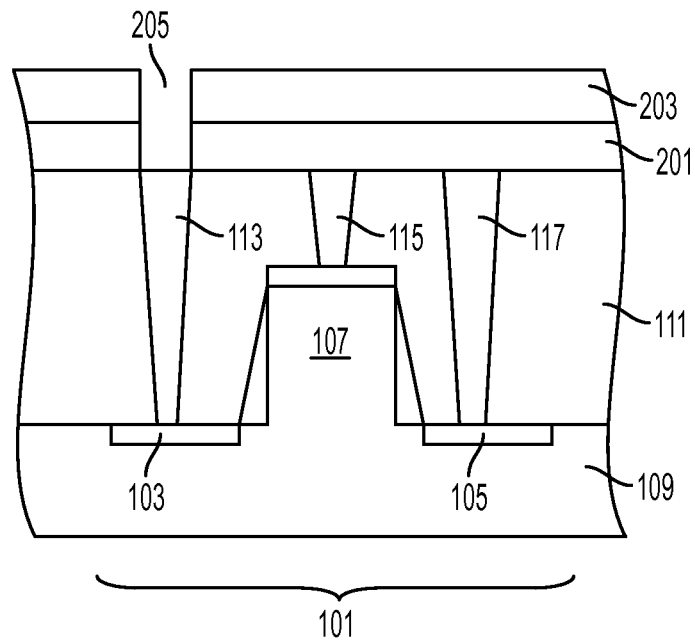
Figure 4:
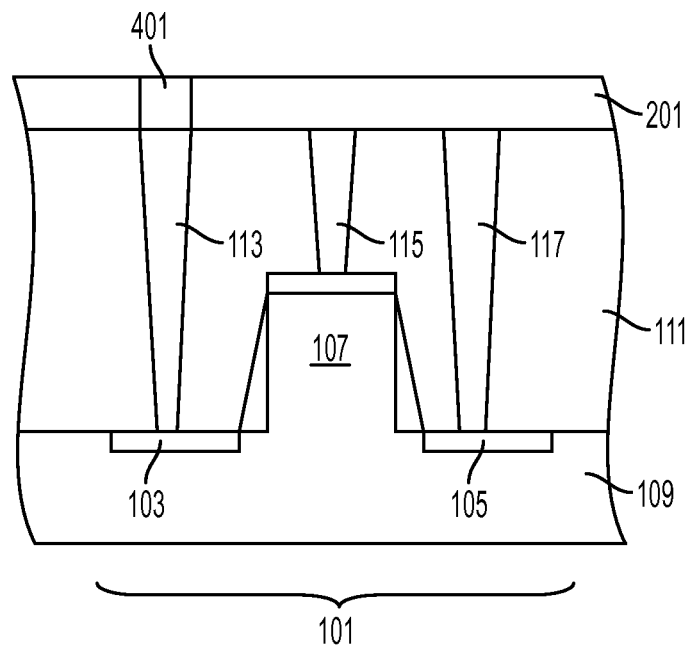

As illustrated in FIG. 3, ILD 2 is etched down to source contact 113 through opening 205. Then, as illustrated in FIG. 4, lithography mask 203 may be removed, such as by stripping, and intermediate contact 401 is metalized by any suitable method.

Figure 5:
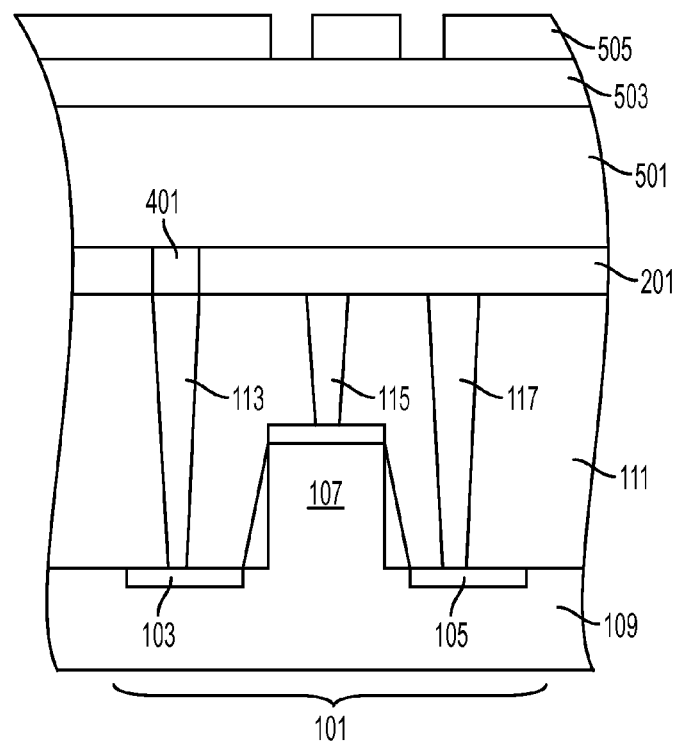

Adverting to FIG. 5, the body 501 of the nano channel plate is deposited. Body 501 may, for example, be formed of either p- or n-doped polysilicon. The polysilicon may, for example, be doped with phosphorus or boron. Alternatively, body 501 may be formed of germanium, or any conductor that is patternable. A third ILD 503, for example an oxide or a nitride, is deposited to a thickness of 50 nm to 150 nm. Another lithography mask 505 is applied on ILD 503, with openings for defining contacts to drain 105 and gate 107.

Figure 6:
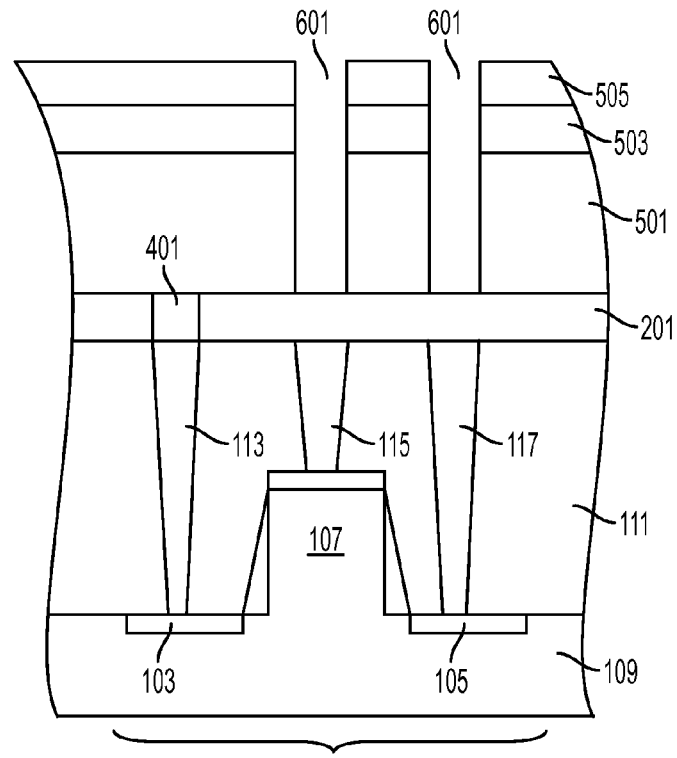

As illustrated in FIG. 6, using lithography mask 505, third ILD 503 and body 501 are etched down to second ILD 201 forming holes 601. The etching may be performed in a single step by leveraging the different etch chemistries of third ILD 503 and body 501. Further, the etching may be dry etching or reactive ion etching (RIE). ILD 201 must be formed of a material which may act as an etch stop for the etching of body 501.

Figure 7:
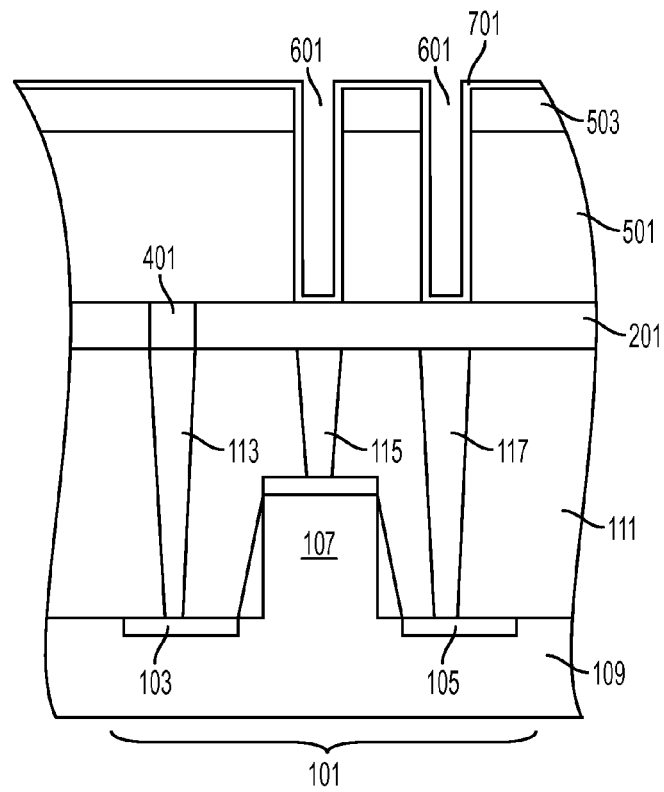

Then, lithography mask 505 is stripped, and an insulating liner 701 is deposited into the etched holes, for example to a thickness up to 5 nm, e.g., up to 3 nm, as illustrated in FIG. 7. Liner 701 may be formed of silicon oxide or a high-k oxide, for example hafnium oxide or zirconium oxide.

Figure 8:
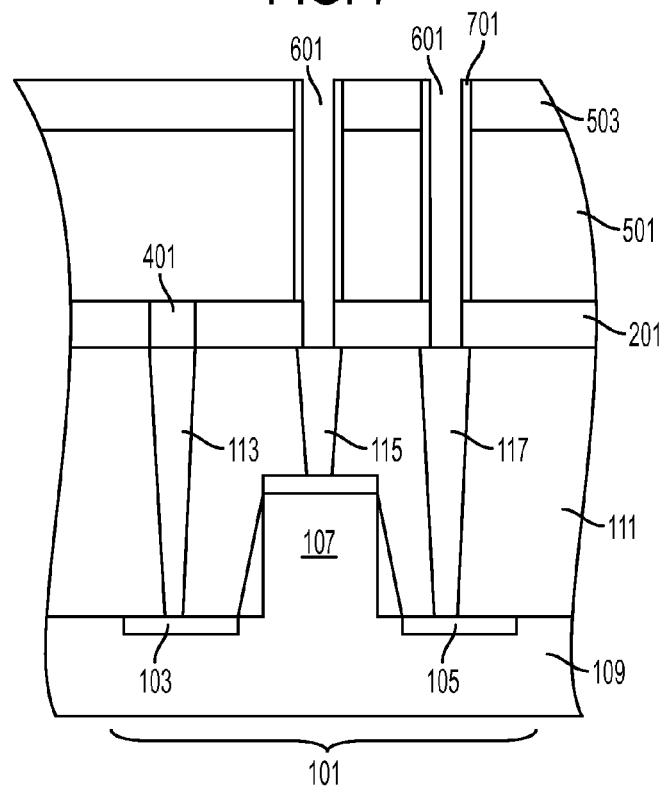
Figure 9:
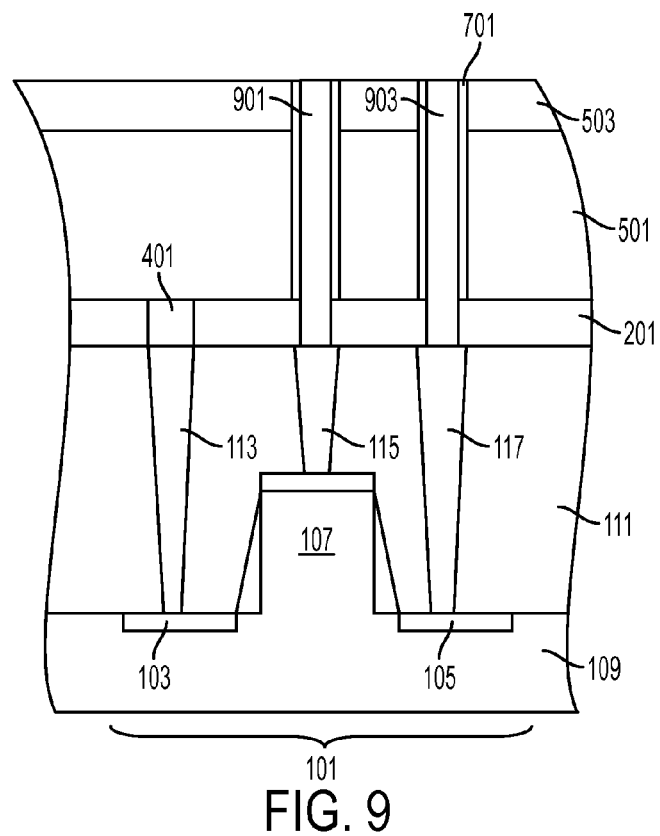

Adverting to FIG. 8, ILD 201 is etched through holes 601 down to gate and drain contacts 115 and 117, respectively.

Then, holes 601 are filled with metal, to form contacts 901 and 903. The holes may be metalized by any suitable method. Liner 701 separates contacts 901 and 903 from body 501.

Figure 10:
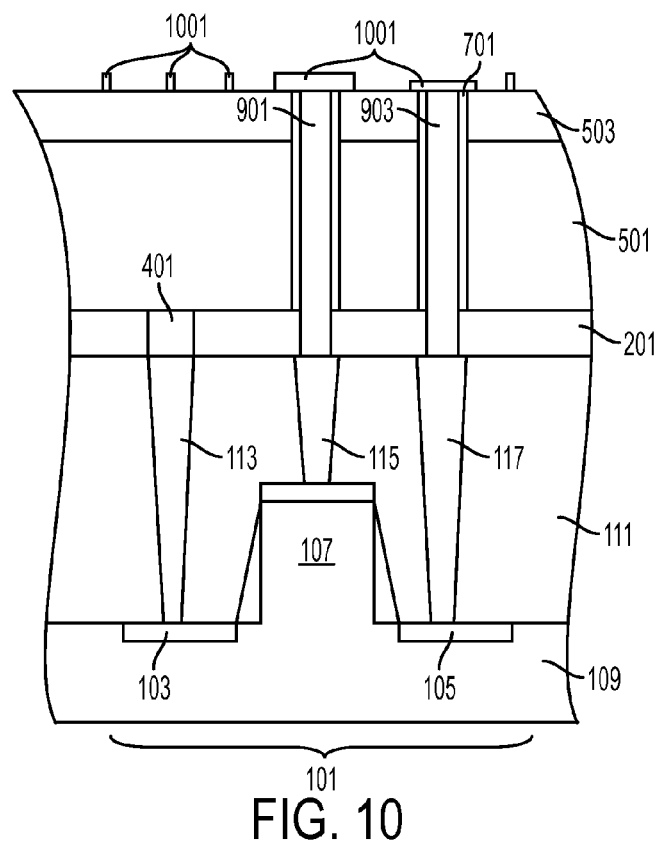

As illustrated in FIG. 10, a nano patterning mask 1001 is applied on third ILD 503. Mask 1001 may include between 2 and 10 features, and the features may have a pitch of 50 nm to 100 nm.

In FIG. 11, ILD 503 and body 501 are etched through nano patterning mask 1001, most, but not all, of the way down to ILD 201. The etching may be time based, leaving 10% to 20% of body 501 unetched, such that multiple channels are formed in body 501. The channels are all connected (not shown for illustrative convenience). The remaining portion of body 501 forms a first electrode for a capacitor plate, and the use of multiple heights generates a large capacitor area.

Adverting to FIG. 12, mask 1001 is stripped, and an insulating layer 1201 is deposited in the channels. Insulating layer 1201 may be a high-k insulator, for example hafnium oxide or zirconium oxide, and forms an insulator for the capacitor plate.

Figure 13:
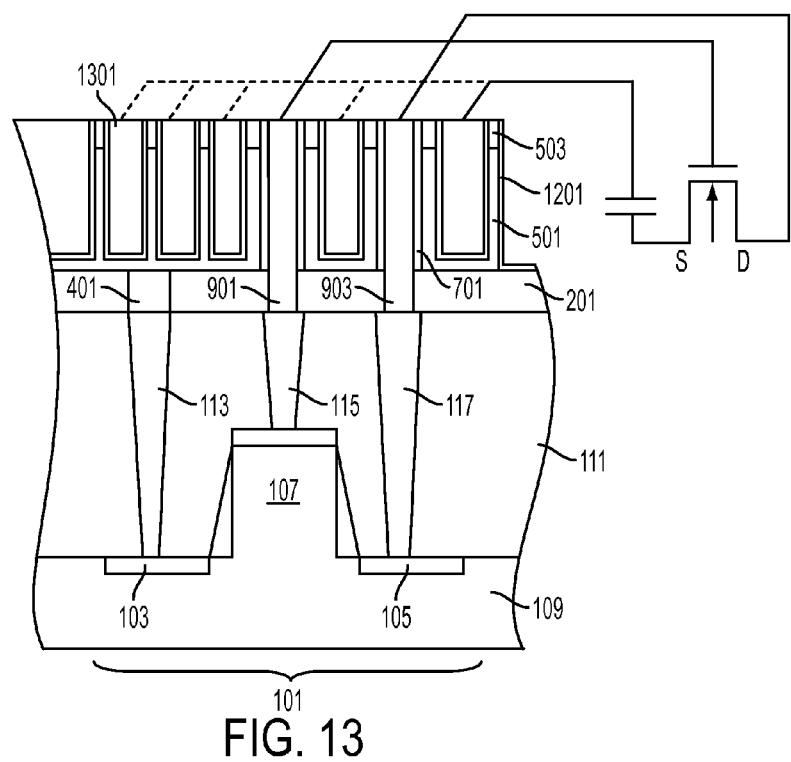
Figure 14:
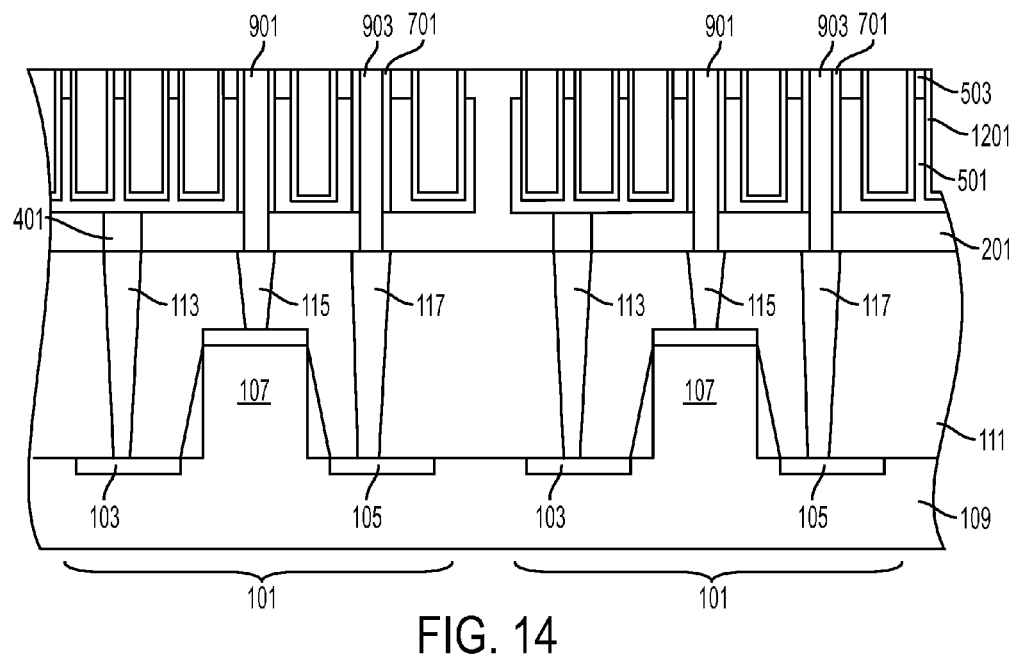

The channels may then be metalized forming metalized channels 1301, as illustrated in FIG. 13, which will serve as the second electrode for the capacitor plate. As shown in FIG. 13, source 103 of transistor 101 is attached to the body of the capacitor plate, the metalized nano channels 1301 serve as ground, and connections to the word and bit line are generated. As illustrated in FIG. 14, devices such as that of FIG. 13 may be combined.

The embodiments of the present disclosure can achieve several technical effects, including more efficient ILD patterning, a reduction in the number of manufacturing steps, and improved capacitance. The present disclosure enjoys industrial applicability in any of various types of highly integrated semiconductor devices such as DRAMs and eDRAMS.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a source contact through a first inter layer dielectric (ILD);
   forming a conductive body on the first ILD;
   forming a second ILD on the conductive body;
   forming drain and gate contacts through the second ILD, conductive body, and first ILD;
   forming nano channels in the conductive body;
   forming an insulating layer in the channels; and
   metalizing the channels.

2. The method according to claim 1, comprising forming the drain and gate contacts by:
   forming first openings through the second ILD and conductive body;
   forming an insulating liner in the first openings;
   forming a second opening through the first ILD; and
   filling the first and second openings with metal.

3. The method according to claim 2, comprising forming the first openings by:
   forming a mask on the second ILD; and etching the second ILD and conductive body through the mask.

4. The method according to claim 2, comprising forming the insulating liner of silicon oxide or a high-k oxide.

5. The method according to claim 4, comprising forming the insulating liner to a thickness less than 5 nanometers (nm).

6. The method according to claim 3, comprising forming the first ILD of a material that has etch selectivity with the conductive body.

7. The method according to claim 6, comprising:
forming the conductive body of doped polysilicon; and
forming the first ILD of silicon nitride.

8. The method according to claim 1, comprising forming the nano channels by:
forming an opening through the second ILD; and
forming an opening in the conductive body.

9. The method according to claim 8, comprising forming the openings by:
forming a nano patterning mask on the second ILD;
etching the second ILD through the nano patterning mask;
partially etching the conductive body through the nano patterning mask; and
removing the nano patterning mask.

10. The method according to claim 9, comprising etching the conductive body to a depth of 80% to 90% of the thickness of the conductive body.

11. The method according to claim 9, comprising forming the nano patterning mask having features with a pitch of 50 nanometers (nm) to 100 nm.

12. The method according to claim 1, further comprising forming the insulating layer of a high-k material.

13. A method comprising:
forming a first inter layer dielectric (ILD) on at least one transistor;
forming a source contact through the first ILD for each transistor;
forming a conductive body of doped polysilicon on the first ILD;
forming a second ILD on the conductive body;
forming a drain contact and a gate contact for each transistor through the second ILD, conductive body, and first ILD, and electrically insulating the drain and gate contacts from the conductive body with a silicon oxide or high-k oxide liner;
forming nano channels in the conductive body;
depositing an insulating layer in the nano channels; and
metalizing the channels.

14. The method according to claim 13, comprising forming the nano channels by:
forming a mask on the second ILD, the mask having features with a pitch of 50 nanometers (nm) to 100 nm;
etching the second ILD through the mask;
etching the conductive body through the mask to a depth of 80% to 90% of the thickness of the conductive body; and
removing the mask.

* * * * *